(12) United States Patent
Wilk et al.

(10) Patent No.: US 7,055,229 B2
(45) Date of Patent: Jun. 6, 2006

(54) SUPPORT SYSTEM FOR SEMICONDUCTOR WAFERS AND METHODS THEREOF

(75) Inventors: Brian Wilk, Portland, OR (US); Frank Joyce, Portland, OR (US); Douglas Kreager, Portland, OR (US); Thomas A. Repko, Dallas, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/748,170

(22) Filed: Dec. 31, 2003

(65) Prior Publication Data

US 2005/0139228 A1    Jun. 30, 2005

(51) Int. Cl.
*B25B 27/14*    (2006.01)

(52) U.S. Cl. .................. 29/281.1; 269/21; 451/388

(58) Field of Classification Search ............... 269/21, 269/20, 289 R, 900; 451/364, 388; 29/281.1
See application file for complete search history.

(56) References Cited

U.S. PATENT DOCUMENTS

| | | | |
|---|---|---|---|
| 4,535,834 A * | 8/1985 | Turner ............... | 165/80.2 |
| 4,603,466 A | 8/1986 | Morley | |
| 6,012,509 A * | 1/2000 | Nonaka ............... | 165/80.2 |
| 6,464,790 B1 * | 10/2002 | Sherstinsky et al. ..... | 118/715 |
| 6,852,019 B1 * | 2/2005 | Togawa et al. ......... | 451/288 |
| 2003/0026904 A1 * | 2/2003 | Yadav et al. ........... | 427/294 |
| 2003/0037400 A1 | 2/2003 | Hunter et al. | |
| 2003/0211813 A1 * | 11/2003 | Kassir et al. .......... | 451/28 |
| 2003/0234078 A1 | 12/2003 | Hsu et al. | |

* cited by examiner

*Primary Examiner*—Lee D. Wilson
(74) *Attorney, Agent, or Firm*—Pearl Cohen Zedek Latzer, LLP

(57) ABSTRACT

A semiconductor wafer may be secured to a wafer support system by causing a supported surface of the semiconductor wafer to be at a lower gas pressure than an exposed surface of the semiconductor wafer.

13 Claims, 11 Drawing Sheets

US 7,055,229 B2

SUPPORT SYSTEM FOR SEMICONDUCTOR WAFERS AND METHODS THEREOF

BACKGROUND OF THE INVENTION

A semiconductor wafer goes through different processes before its individual dies are packaged. A non-exhaustive list of examples for such processes are wafer back side grinding, wafer back side metallization, wafer dicing by laser and saw, testing, good die marking, die ejection and die placement on a tape. The wafer may need to be mechanically supported during processing. The wafer may also need to be transported between process tools in a fabrication plant (FAB) or a packaging facility.

A semiconductor wafer may have a diameter of, for example, 300 millimeters, and a thickness of, for example, 762 micrometers. After back side grinding, the wafer thickness may be reduced, for example, to a thickness in the range of approximately 50 to approximately 100 micrometers. A wafer with such a thickness may be fragile and may require careful handling.

BRIEF DESCRIPTION OF THE DRAWINGS

Embodiments of the invention are illustrated by way of example and not limitation in the figures of the accompanying drawings, in which like reference numerals indicate corresponding, analogous or similar elements, and in which.

It will be appreciated that for simplicity and clarity of illustration, elements shown in the figures have not necessarily been drawn to scale. For example, the dimensions of some of the elements may be exaggerated relative to other elements for clarity.

DETAILED DESCRIPTION OF EMBODIMENTS OF THE INVENTION

In the following detailed description, numerous specific details are set forth in order to provide a thorough understanding of embodiments of the invention. However it will be understood by those of ordinary skill in the art that the embodiments of the invention may be practiced without these specific details. In other instances, well-known methods, procedures, components and circuits have not been described in detail so as not to obscure the embodiments of the invention.

Figure 1:
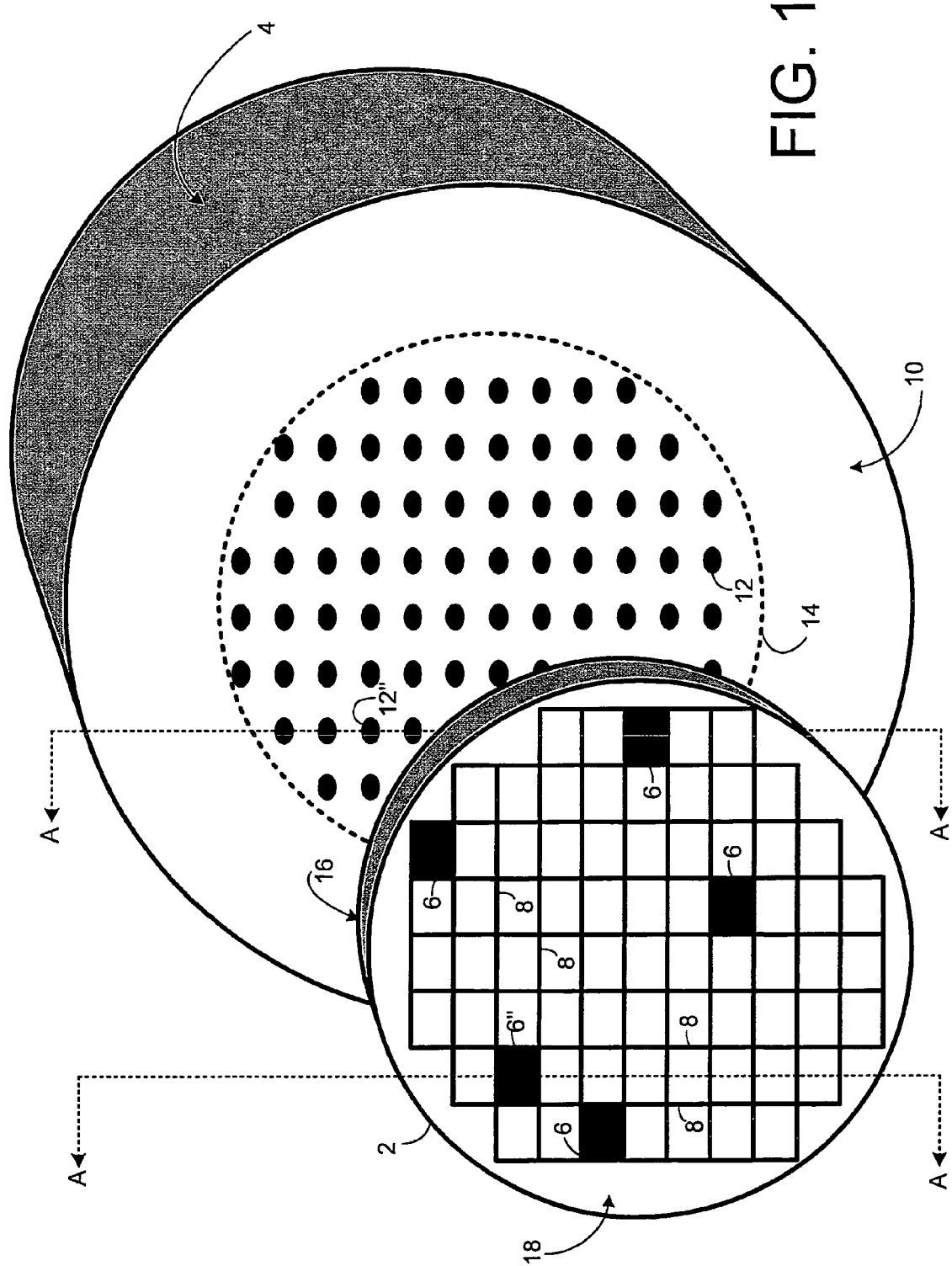
FIG. 1 is an exploded view of an exemplary semiconductor wafer and an exemplary wafer support system, in accordance with some embodiments of the invention.
Figure 2:
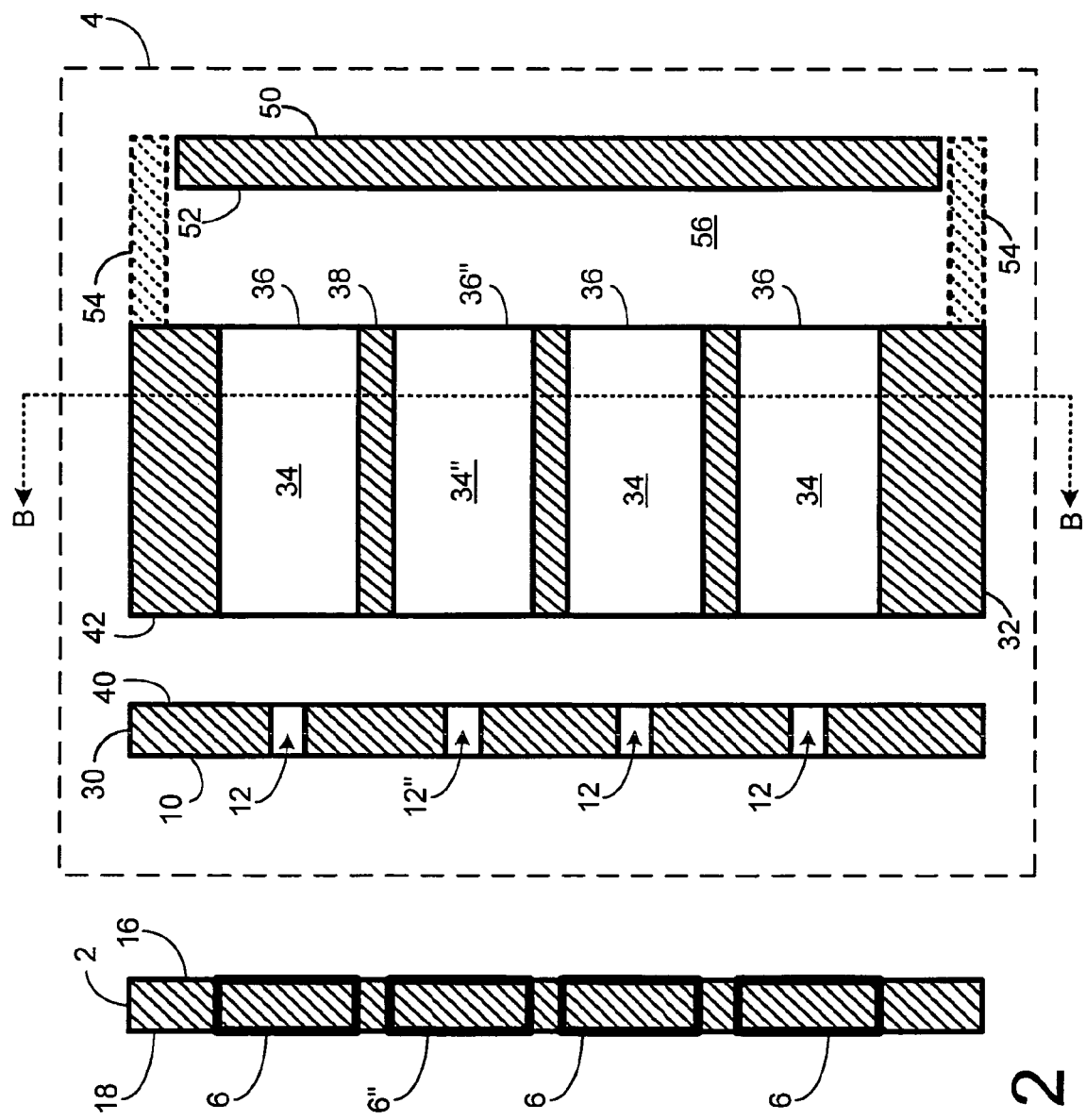
FIG. 2 is a cross-sectional view of part of the semiconductor wafer of FIG. 1 and part of the wafer support system of FIG. 1, in accordance with some embodiments of the invention.
Figure 3:
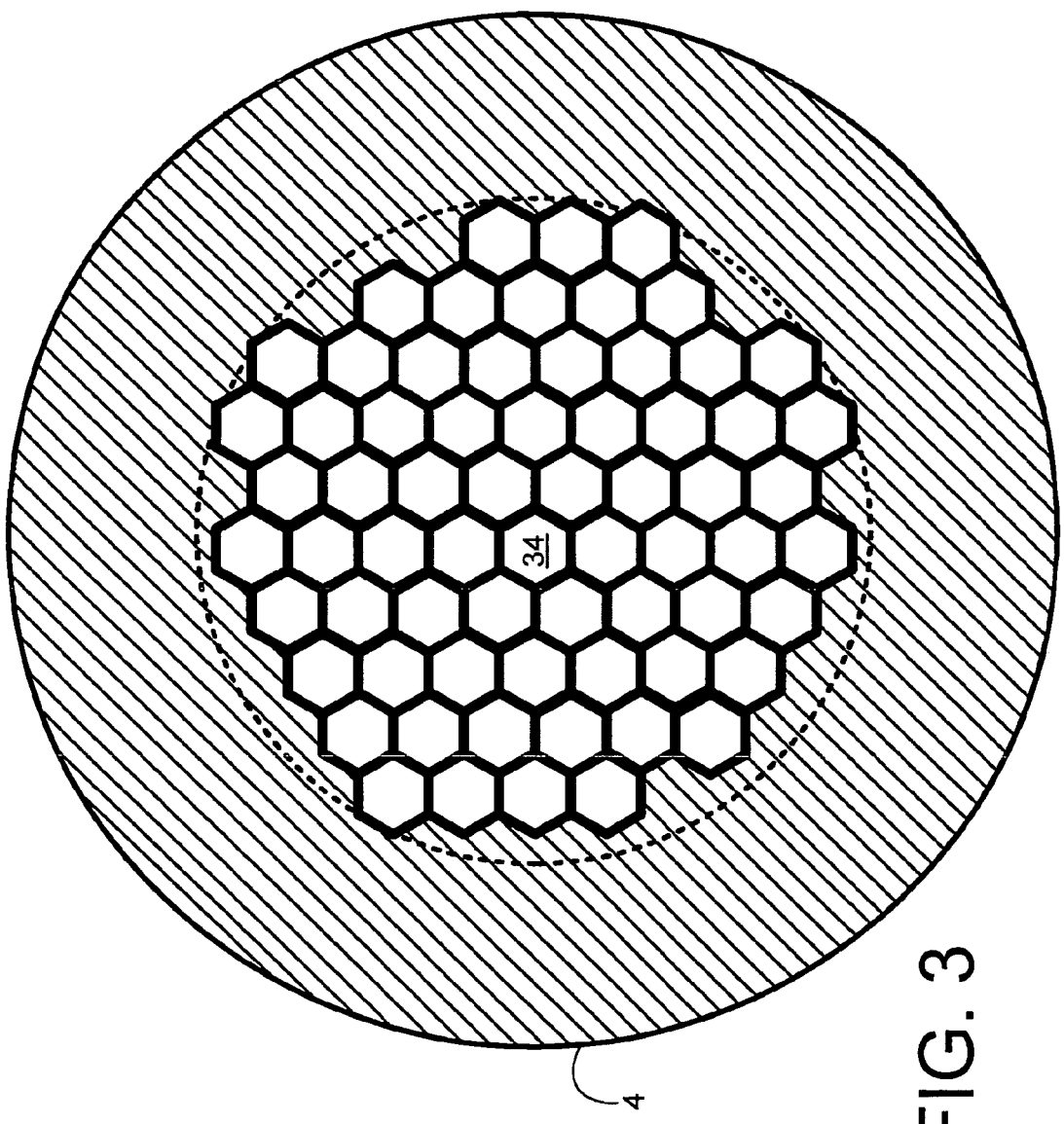
FIG. 3 is a cross-sectional view of part of the wafer support system of FIG. 1, in accordance with some embodiments of the invention.

Referring to FIG. 1 and FIG. 2, an exemplary semiconductor wafer 2 and a wafer support system 4 in accordance with some embodiments of the invention is illustrated. FIG. 1 is an exploded view of semiconductor wafer 2 and wafer support system 4, while FIG. 2 is a cross-sectional view of part of semiconductor wafer 2 and part of wafer support system 4 along a cross-section A, and FIG. 3 is a cross-sectional view of part of wafer support system 4 along a cross-section B.

As shown in FIG. 1, semiconductor wafer 2 may have a disk shape, although any other shape of semiconductor wafer 2 is also contemplated. Semiconductor wafer 2 may include dies, such as exemplary dies 6, separated by scribe lines (also known as "streets"), such as exemplary scribe lines 8. Dies 6 may have a rectangular shape, although any other shape of dies 6 is also contemplated. Moreover, although not shown explicitly in FIG. 1, semiconductor wafer 2 may include dies of different shapes and sizes.

Semiconductor wafer 2 may go through different processes, such as, for example, surface grinding and surface metallization. In addition, particular dies 6, such as for example, the die denoted 6", may be sawed out of semiconductor wafer 2 by, for example, a laser saw or a mechanical saw. Sawed die 6" may be ejected from semiconductor wafer 2 and may be placed on a tape (not shown).

A non-exhaustive list of examples for the diameter of semiconductor wafer 2 includes approximately 150 millimeters, approximately 200 millimeters and approximately 300 millimeters. Semiconductor wafer 2 may have a thickness in the range, for example, of approximately 700 micrometers to approximately 800 micrometers, such as, for example, a thickness of approximately 762 micrometers. A surface grinding process may reduce the thickness of semiconductor wafer 2 to a thickness in the range, for example, of approximately 50 to approximately 100 micrometers.

Wafer support system 4 may have a substantially rigid perforated surface 10 having openings 12. Openings 12 may be concentrated in an area defined by a curve 14 having substantially the same shape as semiconductor wafer 2. Openings 12 may have a substantially round shape, although any other shape of openings 12 is also contemplated.

Semiconductor wafer 2 may be secured to wafer support system 4 by placing a supported surface 16 of semiconductor wafer 2 in contact with perforated surface 10 so that openings 12 are substantially blocked by semiconductor wafer 2, and in addition, by causing an exposed surface 18 of semiconductor wafer 2 to be at a gas pressure higher than a gas pressure applied to supported surface 16 through openings 12.

While semiconductor wafer 2 is secured to wafer support system 4, semiconductor wafer 2 may be transported together with wafer support system 4. Moreover, while semiconductor wafer 2 is secured to wafer support system 4, processes such as, for example, wafer back side grinding, wafer back side metallization, wafer dicing by laser and saw, testing, good die marking, die ejection and die placement on a tape, may be applied to semiconductor wafer 2. The rigidity of perforated surface 10 may reduce or eliminate flexing of semiconductor wafer 2 during handling, transporting and processing.

Secured semiconductor wafer 2 may be released from wafer support system 4 by causing exposed surface 18 to be at a gas pressure lower than or substantially equal to the gas pressure applied to supported surface 16 through openings 12.

Moreover, one or more sawed dies of secured semiconductor wafer 2, such as, for example, die 6", may be released from wafer support system 4 by increasing the gas pressure applied to supported surface 16 through openings that are blocked by those sawed dies, for example, opening 12", while maintaining the gas pressure applied to supported surface 16 through other openings 12. Sawed die 6", after being released from wafer support system 4, may be separated from wafer support system 4 by a die picking tool (not shown). Since there is no adhesive holding sawed die 6" to wafer support system 4, the removal of sawed die 6" with a die picking tool does not involve the pulling, peeling or prying generally required to remove a die from an adhesive surface.

As shown in FIG. 2, wafer support system 4 may include a first part that is a substantially rigid perforated plate 30 having perforated surface 10 and openings 12. In addition, wafer support system 4 may include a second part 32 having multiple cavities 34.

As shown in FIG. 3, cavities 34 may be arranged in a honeycomb structure, although any other arrangement of cavities is also contemplated. For example, cavities 34 may have a hexagonal shape, although any other shape of cavity 34, such as, for example, a rectangle, a circle, and the like is also contemplated.

According to a first embodiment of the invention, for every opening 12 in perforated plate 30, part 32 may have a corresponding cavity 34. For example, a cavity 34" may correspond to opening 12".

According to a second embodiment of the invention, for every opening 12 in perforated plate 30, part 32 may have multiple corresponding cavities 34. According to a third embodiment of the invention, for every cavity 34 in part 32, perforated plate 30 may have multiple openings 12.

The number, size, shape and arrangement of cavities 34 may be chosen to suit the arrangement of dies on the semiconductor wafer. In addition, a smallest of cavities 34 may be substantially equivalent in area to an area of a smallest of dies on semiconductor wafer 2.

Cavities 34 may have orifices 36 on a surface 38 of part 32. According to one embodiment of the invention, a cavity 34 may have one corresponding orifice 36. According to a second embodiment of the invention, a cavity 34 may have more than one corresponding orifice 36.

Perforated plate 30 and part 32 may be attached so that a surface 40 of perforated plate 30 and a surface 42 of part 32 are touching. Alternatively, perforated plate 30 and part 32 may be manufactured as a single body having surface 10 with openings 12 and an opposite surface 38 with orifices 36, where the openings and orifices are joined by cavities.

Gas may be substantially trapped inside cavities 34 if
  a. supported surface 16 of semiconductor wafer 2 is in contact with perforated surface 10 so that openings 12 are substantially blocked by semiconductor wafer 2, with perforated plate 30 functioning substantially as a gasket between supported surface 16 and surface 42 of part 32, and
  b. a membrane 50 is attached to part 32 so that orifices 36 are substantially sealed.

Gas trapped in cavities 34 may apply force to supported surface 16 through openings 12. In addition, gas that is external to cavities 34 may apply force to exposed surface 18.

Figure 4:
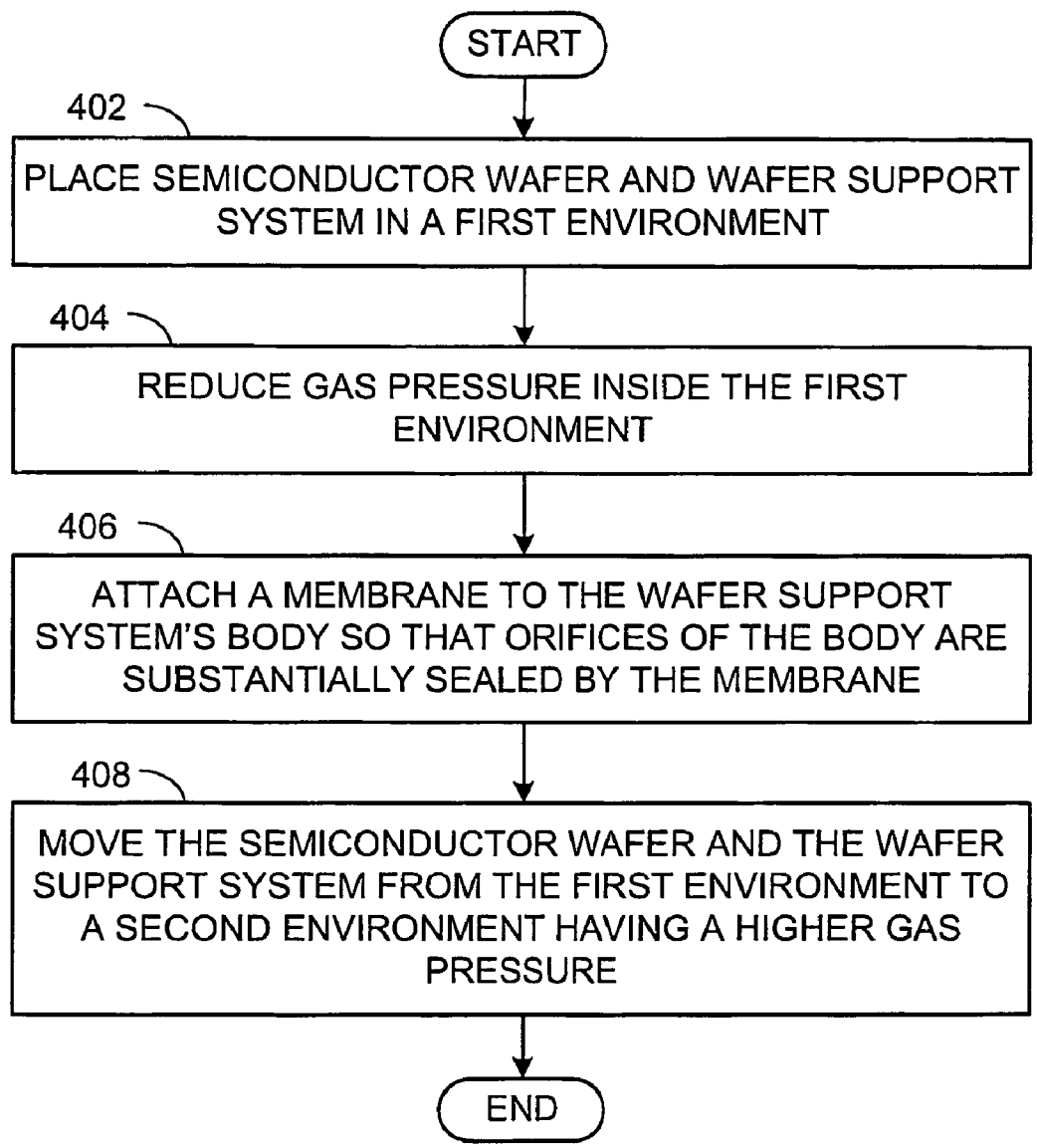
FIG. 4 is a flowchart illustration of a method for securing a semiconductor wafer to a wafer support system, in accordance with some embodiments of the invention.

FIG. 4 is a flowchart illustration of a method for securing semiconductor wafer 2 to wafer support system 4, in accordance with some embodiments of the invention. Semiconductor wafer 2 and wafer support system 4 may be placed in a first environment, for example, a vacuum chamber, with supported surface 16 placed in contact with perforated surface 10 so that openings 12 are substantially blocked (-402-). The gas pressure inside the first environment may be reduced (-404-). Membrane 50 may be attached to part 32 so that orifices 36 are substantially sealed (-406-). Then, wafer support system 4 and semiconductor wafer 2 may be removed from the first environment to a second environment at a gas pressure higher than the gas pressure inside the first environment (-408-). Consequently, the gas pressure inside cavities 34 may be lower than the gas pressure on exposed surface 18.

Figure 5:
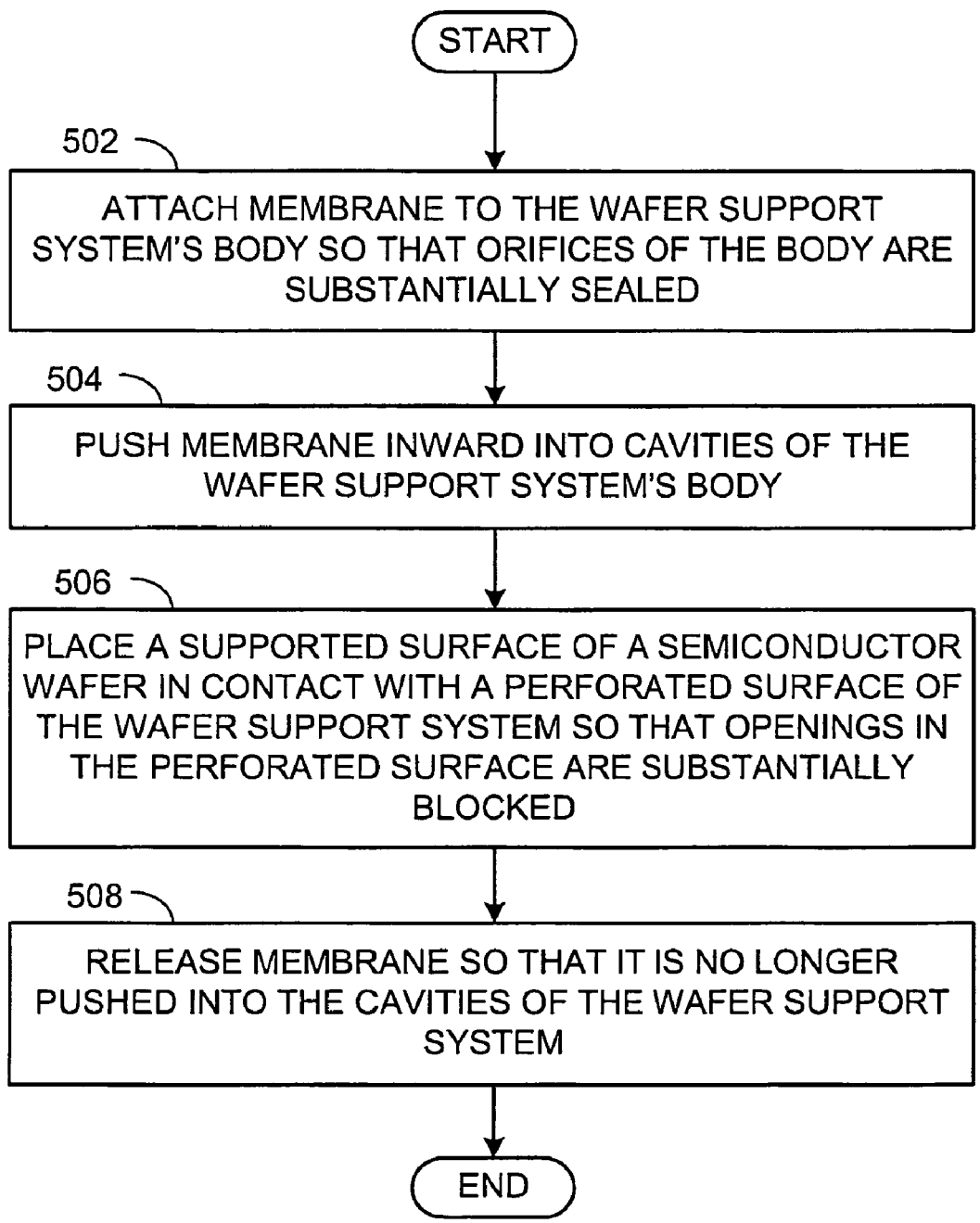
FIG. 5 is a flowchart illustration of another method for securing a semiconductor wafer to a wafer support system, in accordance with some embodiments of the invention.

FIG. 5 is a flowchart illustration of another method for securing semiconductor wafer 2 to wafer support system 4, in accordance with some embodiments of the invention. Membrane 50 may be flexible and may be attached to part 32 so that orifices 36 are substantially sealed (-502-). Membrane 50 may be pushed inwards into cavities 34 (-504-). Then, supported surface 16 may be placed in contact with perforated surface 10 so that openings 12 are substantially blocked (-506-), and membrane 50 may be released so it is no longer pushed into cavities 34 (-508-). Consequently, the gas pressure inside cavities 34 may be lower than the gas pressure on exposed surface 18.

Figure 6:
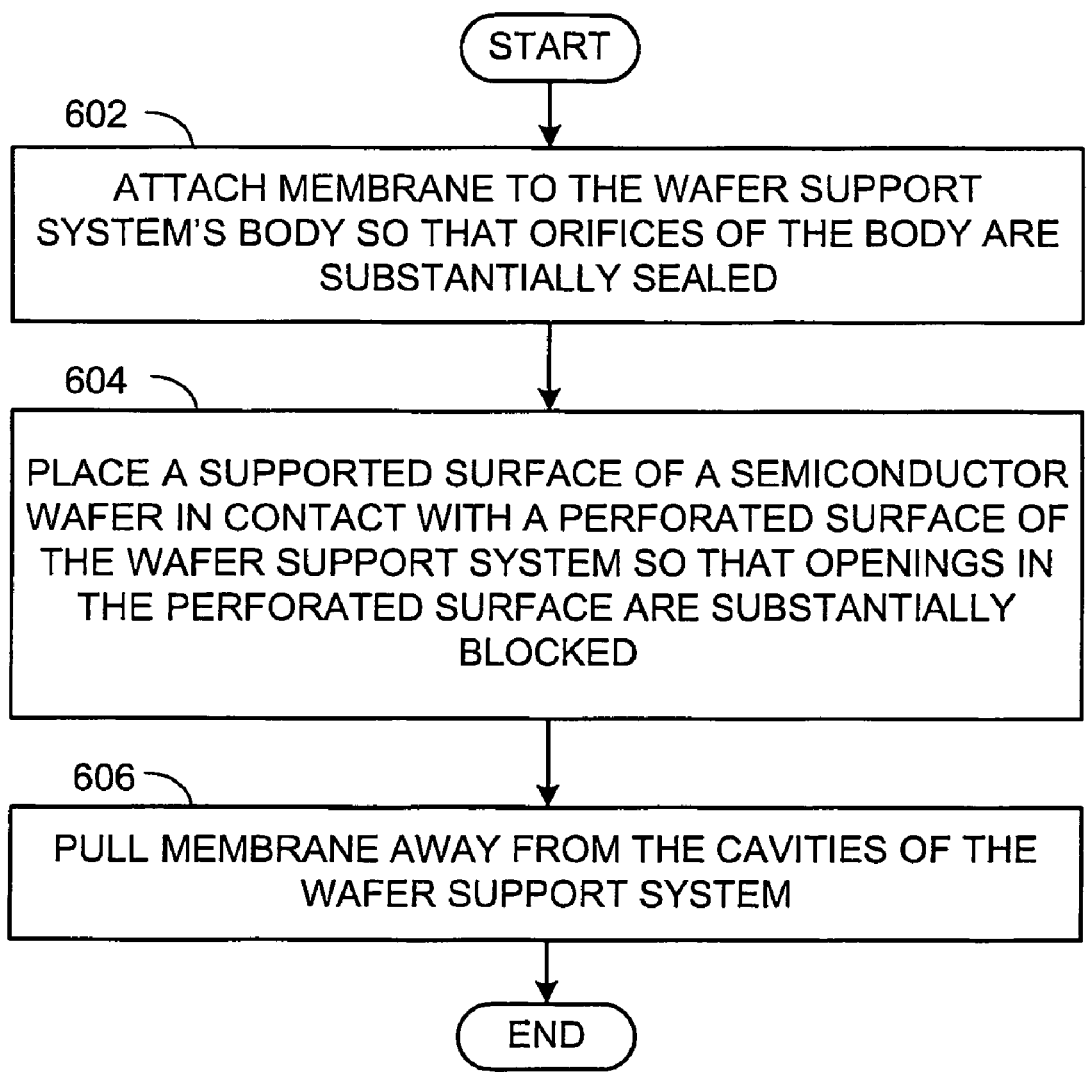
FIG. 6 is a flowchart illustration of yet another method for securing a semiconductor wafer to a wafer support system, in accordance with some embodiments of the invention.

FIG. 6 is a flowchart illustration of another method for securing semiconductor wafer 2 to wafer support system 4, in accordance with some embodiments of the invention. In some embodiments of the invention, part 32 may optionally have perimeter walls 54, extending beyond surface 38, and membrane 50 may be rigid. Membrane 50 may be attached to part 32 so that orifices 36 are substantially sealed (-602-). Supported surface 16 may be placed in contact with perforated surface 10 so that openings 12 are substantially blocked (-604-). Then, membrane 50 may be pulled away from surface 38 so membrane 50 is still within perimeter walls 54 to form a void 56 (-606-). Void 56 and cavities 34 may be sealed by membrane 50 and perimeter walls 54. Consequently, the gas pressure inside cavities 34 and void 56 may be lower than the gas pressure on exposed surface 18.

Figure 7:
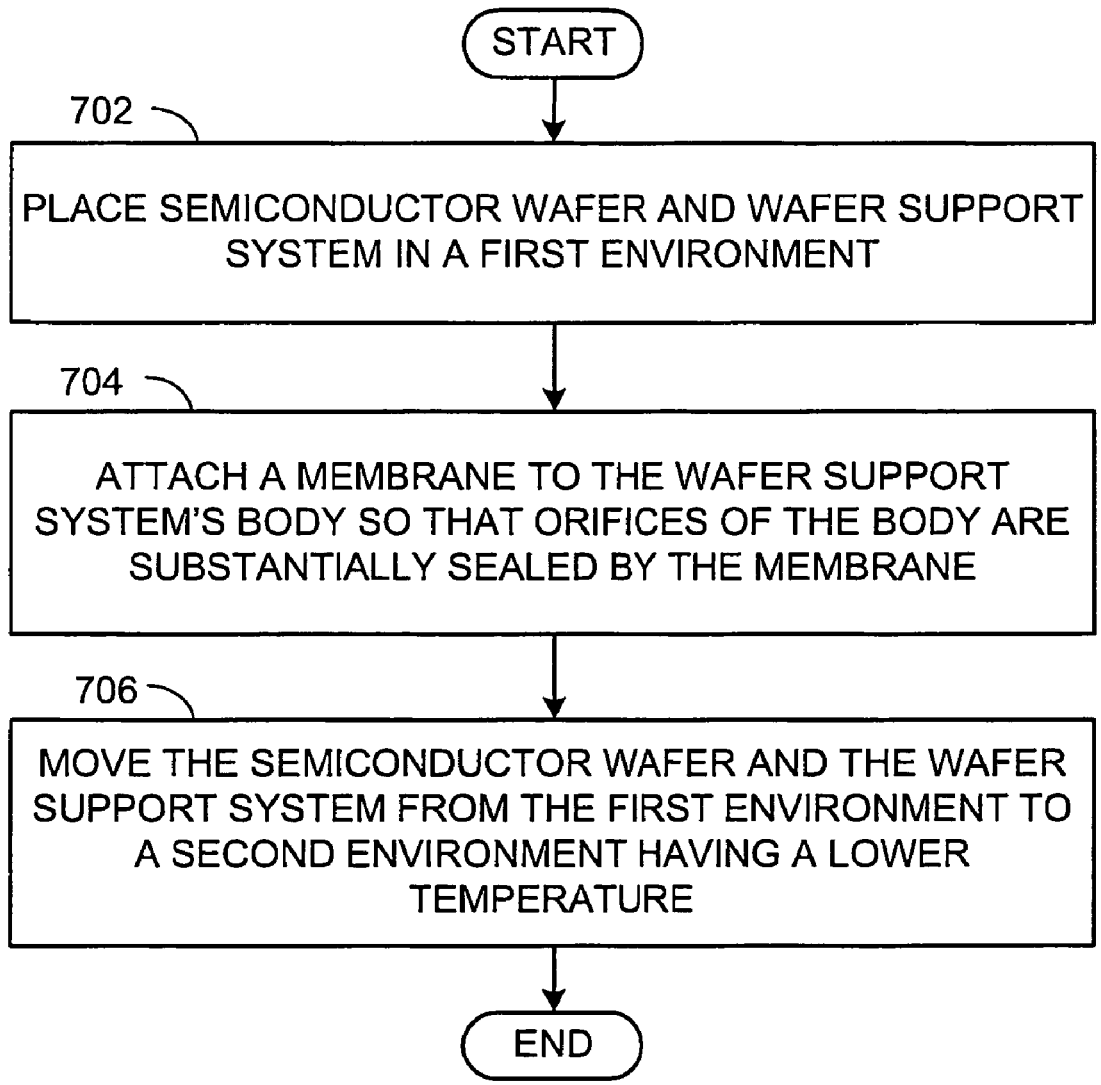
FIG. 7 is a flowchart illustration of a further method for securing a semiconductor wafer to a wafer support system, in accordance with some embodiments of the invention.

FIG. 7 is a flowchart illustration of a further method for securing semiconductor wafer 2 to wafer support system 4, in accordance with some embodiments of the invention. Semiconductor wafer 2 and wafer support system 4 may be placed in a first environment at a first temperature, with supported surface 16 placed in contact with perforated surface 10 so that openings 12 are substantially blocked (-702-). Membrane 50 may be attached to part 32 so that orifices 36 are substantially sealed (-704-). Then, wafer support system 4 and semiconductor wafer 2 may be removed from the first environment to a second environment at a second temperature that is lower than the first temperature (-706-). Since the air in the first environment is less dense than that in the second environment, once wafer support system 4 and semiconductor wafer 2 are in the second environment, the air pressure inside cavities 34 may be lower than the air pressure on exposed surface 18.

FIGS. 8A, 8B, 8C and 8D are flowchart illustrations of alternate methods for releasing semiconductor wafer 2 from wafer support system 4, in accordance with some embodiments of the invention.

Figure 8A:
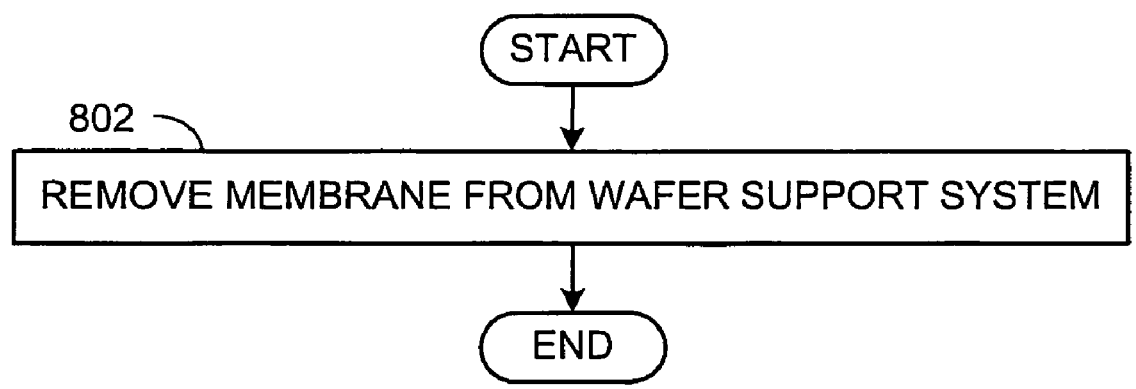
FIGS. 8A, 8B, 8C and 8D are flowchart illustrations of alternate methods for releasing a semiconductor wafer from a wafer support system, in accordance with some embodiments of the invention.

In FIG. 8A, membrane 50 may be removed from wafer support system 4 (-802-) to cause the gas pressure inside cavities 34 to become substantially equal to the gas pressure on exposed surface 18, thus releasing semiconductor wafer 2 from wafer support system.

Figure 8B:
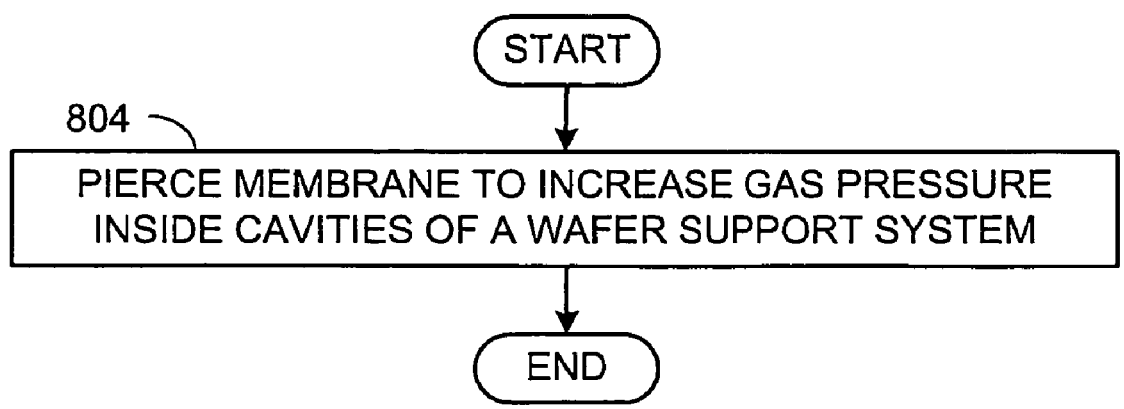

In FIG. 8B, membrane 50 may be pierced (-804-), and the gas pressure inside cavities 34 may become equal to the gas pressure on exposed surface 18. In a modified version of this method, one or more sawed dies may be individually released from wafer support system 4. For example, sawed die 6" may be individually released from wafer support system 4 by piercing flexible membrane 50 into orifice 36" in such a way that the gas pressure in cavity 34" may become equal or higher than the gas pressure surrounding wafer support system 4, and the gas pressure in the other cavities 34 may not be affected.

Figure 8C:
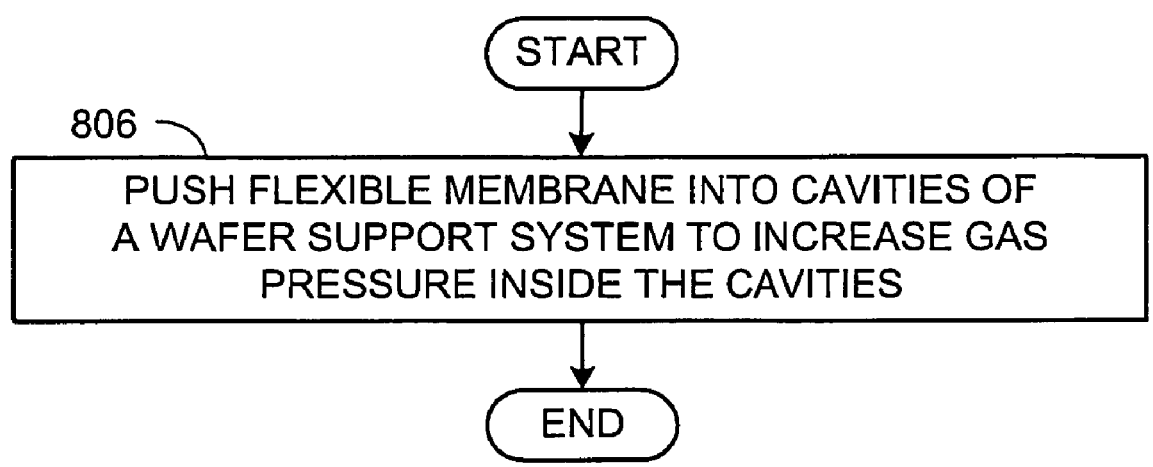

In FIG. 8C, if membrane 50 is flexible, membrane 50 may be pushed inwards into cavities 34 (-806-), and the gas pressure inside cavities 34 may become equal or higher than the gas pressure on exposed surface 18. In a modified version of this method, one or more sawed dies may be individually released from wafer support system 4. For example, sawed die 6" may be individually released from wafer support system 4 by pushing flexible membrane 50 into orifice 36" in such a way that the gas pressure in cavity 34" may become equal or higher than the gas pressure surrounding wafer support system 4, and the gas pressure in the other cavities 34 may not be affected.

Figure 8D:
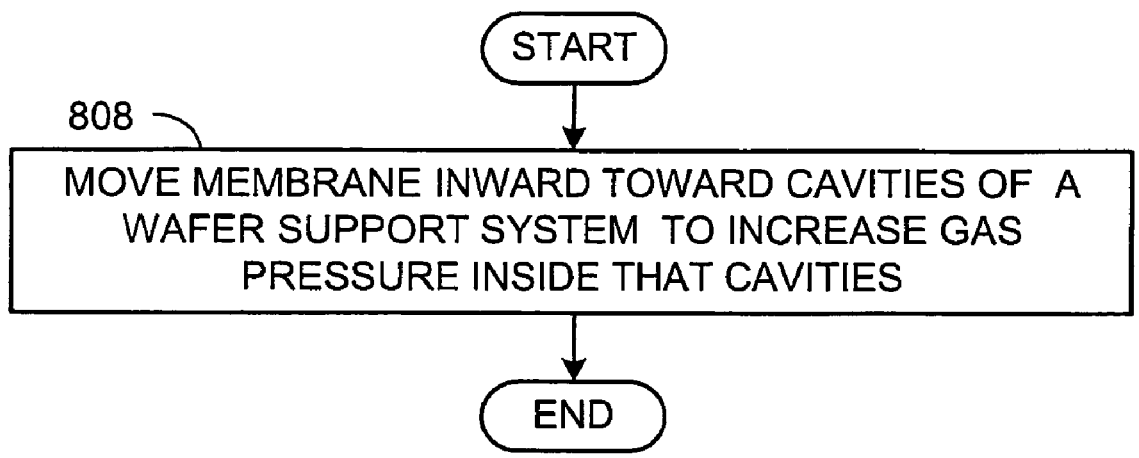

FIG. 8D is applicable, for example, in the event that part 32 has perimeter walls 54 extending beyond surface 38 and membrane 50 is rigid membrane. Membrane 50 may be moved inwards toward surface 38 (-808-). The gas pressure inside cavities 34 and void 56 may increase and may become equal or higher than the gas pressure on exposed surface 18.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method comprising:
    attaching a supported surface of a semiconductor wafer to a perforated surface of a wafer support system; and
    trapping inside one or more cavities of said wafer support system a lower gas pressure than a gas pressure at an exposed surface of said semiconductor wafer,
    wherein said lower gas pressure inside said one or more cavities is maintainable without a vacuum source.

2. The method of claim 1, wherein trapping said lower gas pressure includes at least:
    placing said semiconductor wafer with said wafer support system inside a vacuum chamber;
    reducing a gas pressure inside said vacuum chamber to substantially said lower gas pressure;
    sealing an opposite surface of said wafer support system; and
    removing said wafer support system and said secured semiconductor wafer from said vacuum chamber.

3. The method of claim 1, wherein trapping said lower gas pressure includes at least:
    placing said semiconductor wafer with said wafer support system in a first environment at a first temperature;
    sealing an opposite surface of said wafer support system; and
    removing said wafer support system and said secured semiconductor wafer from said first environment to a second environment at a second temperature that is lower than said first temperature.

4. The method of claim 1, wherein trapping said lower gas pressure includes at least:
    pushing a flexible surface of said wafer support system inwards towards a perforated surface of said wafer support system;
    placing said supported surface of said semiconductor wafer in contact with said perforated surface of said wafer support system; and
    releasing said flexible surface.

5. The method of claim 1, wherein trapping said lower gas pressure includes at least:
    placing said supported surface of said semiconductor wafer in contact with a perforated surface of said wafer support system; and
    pulling an opposite surface of said support system outwards away from said perforated surface.

6. The method of claim 1, further comprising:
    releasing said semiconductor wafer from said wafer support system by increasing said lower gas pressure.

7. The method of claim 6, wherein said supported surface is supported by a perforated surface of said wafer support system, and increasing said lower gas pressure includes at least:
    removing an opposite surface of said wafer support system.

8. The method of claim 6, wherein increasing said lower gas pressure includes at least:
    pushing a flexible surface of said wafer support system inwards towards said semiconductor wafer.

9. The method of claim 1, further comprising:
    releasing said semiconductor wafer from said wafer support system by causing said exposed surface to be at a pressure lower than or substantially equal to said lower gas pressure.

10. The method of claim 1, further comprising:
    releasing one or more dies of said semiconductor wafer from said wafer support system by increasing said lower gas pressure on the supported surface of said one or more dies while maintaining said lower gas pressure on the supported surface of other portions of said semiconductor wafer.

11. The method of claim 10, wherein increasing said lower gas pressure on the supported surface of said one or more dies includes at least:
    pushing one or more portions of a flexible surface of said wafer support system inwards towards said one or more dies of said semiconductor wafer.

12. The method of claim 10, wherein increasing said lower gas pressure on the supported surface of said one or more dies includes at least:
    piercing one or more portions of a flexible surface of said wafer support system corresponding to said one or more dies of said semiconductor wafer.

13. The method of claim 10, further comprising:
    separating one of said one or more dies from said semiconductor wafer by coupling a die picking tool to the exposed surface of said one of said one or more dies.

* * * * *